United States Patent
Gepstein

(10) Patent No.: US 10,511,264 B2
(45) Date of Patent: Dec. 17, 2019

(54) ADAPTIVE IMPEDANCE POWER AMPLIFIER

(71) Applicant: OREN BAR-ON LTD., Kfar Sirkin (IL)

(72) Inventor: Ofer Gepstein, Tel-Aviv (IL)

(73) Assignee: Ofer Gepstein, Tel-Aviv (IL)

(*) Notice: Subject to any disclaimer, the term of this patent is extended or adjusted under 35 U.S.C. 154(b) by 0 days.

(21) Appl. No.: 15/528,697

(22) PCT Filed: Nov. 23, 2015

(86) PCT No.: PCT/IL2015/051130
§ 371 (c)(1),
(2) Date: May 22, 2017

(87) PCT Pub. No.: WO2016/084069
PCT Pub. Date: Jun. 2, 2016

(65) Prior Publication Data
US 2017/0310282 A1    Oct. 26, 2017

Related U.S. Application Data

(60) Provisional application No. 62/083,330, filed on Nov. 24, 2014.

(51) Int. Cl.
*H03F 1/02*    (2006.01)
*H03F 1/56*    (2006.01)
(Continued)

(52) U.S. Cl.
CPC ......... *H03F 1/0288* (2013.01); *H03F 1/0205* (2013.01); *H03F 1/0266* (2013.01); *H03F 1/32* (2013.01); *H03F 1/3205* (2013.01); *H03F 1/56* (2013.01); *H03F 3/193* (2013.01); *H03F 3/21* (2013.01); *H03F 2200/102* (2013.01);
(Continued)

(58) Field of Classification Search
USPC ... 330/136, 124 R, 295–297, 84, 286, 53–54
See application file for complete search history.

(56) References Cited

U.S. PATENT DOCUMENTS 2,210,028 A    8/1940    Doherty
6,437,641 B1   8/2002    Bar-David
(Continued)

FOREIGN PATENT DOCUMENTS

EP    2408104    1/2012
JP    H01269304  10/1989

OTHER PUBLICATIONS

Akbarpour et al., A transformer-less Load-Modulated (TILM) architechture for efficient wideband power amplifiers, Microwave Theory and Techniques, IEEE Transactions on 60, No. 9, 2012, pp. 2863-2874 (13 pages).
(Continued)

*Primary Examiner* — Hieu P Nguyen
(74) *Attorney, Agent, or Firm* — Roach Brown McCarthy & Gruber, P.C.; Kevin D. McCarthy

(57) ABSTRACT

The present invention relates to a method, of providing adaptive impedance in a Power Amplifier (PA), by providing more than one transistors in which one transistor is used to change the load line or to linearize the input signal by adapting the biasing of each transistor, wherein the transistors are connected in parallel.

18 Claims, 12 Drawing Sheets

(51) Int. Cl.
　　　*H03F 3/21*　　　(2006.01)
　　　*H03F 3/193*　　(2006.01)
　　　*H03F 1/32*　　　(2006.01)

(52) U.S. Cl.
　　　CPC ...... *H03F 2200/15* (2013.01); *H03F 2200/18* (2013.01); *H03F 2200/451* (2013.01)

(56) References Cited

U.S. PATENT DOCUMENTS

| | | | | |
|---|---|---|---|---|
| 7,986,186 | B2* | 7/2011 | Marbell | H03F 1/0266 |
| | | | | 330/136 |
| 8,274,332 | B2* | 9/2012 | Cho | H03F 1/0261 |
| | | | | 330/124 R |
| 8,604,881 | B2* | 12/2013 | Sankalp | H03F 1/025 |
| | | | | 330/124 R |
| 2004/0174212 | A1* | 9/2004 | Kim | H03F 1/0266 |
| | | | | 330/124 R |
| 2012/0025915 | A1 | 2/2012 | Ui | |
| 2014/0062603 | A1 | 3/2014 | Xue | |

OTHER PUBLICATIONS

Xia et al., High-efficiency GaN Doherty Power Amplifier for 100-MHz LTD-advanced application based on modified load modulation network, Microwave Theory and Techniques, IEEE Transactions on 61, No. 8, 2013, pp. 2911-2921 (11 pages).

International Search Report for PCT/IL2015/051130, dated Mar. 9, 2016 (5 pages).

Written Opinion of the International Searching Authority for PCT/IL2015/051130, dated Mar. 9, 2016 (4 pages).

* cited by examiner (Prior-art)

ADAPTIVE IMPEDANCE POWER AMPLIFIER

FIELD OF THE INVENTION

The present invention relates to the field of Radio Frequency (RF) communication systems. More particularly, the invention relates to an adaptive impedance Power Amplifier (PA) system for providing linearity and efficiency enhancement.

BACKGROUND OF THE INVENTION

Linear power amplifiers that can maintain high efficiencies over wide ranges of output power levels are key components in modern communication systems. Achieving high efficiencies at back-off power levels is important both in base and mobile stations since the former must handle multi-carrier signals with high peak-to-average power ratios (high PARs) and the latter often should operate at low powers to maximize the battery lifetime. On the other hand, these amplifiers must meet stringent linearity requirements to keep the out of band spectral emissions within the Federal Communications Commission (FCC) recommended spectral masks. In addition, with the growth of the quantity of data transfer the amplifier also has to support wider bandwidth.

To fulfill the first two requirements, several techniques have been proposed with two distinct approaches to the problem. Techniques such as envelope elimination and restoration (EER), polar transmitters, and linear amplification using nonlinear components (LINC) improve the linearity of high-efficiency nonlinear amplifiers by driving them with constant-envelope signal(s). Other approach uses bias adaptation or load modulation techniques to improve the efficiency of linear amplifiers.

As disclosed in U.S. Pat. No. 2,210,028, Doherty power amplifiers (DPAs) have demonstrated high efficiencies over wide ranges of output power levels. They are simple, easy to implement and relatively wideband as compared to other efficiency enhancement techniques.

A classic Doherty amplifier consists of two amplifiers a main amplifier and an auxiliary amplifier (see FIG. 1A and its corresponding graphs in FIGS. 1B-1E). The main amplifier is used as a carrier amplifier and biased to operate in Class AB mode, where the auxiliary amplifier is used as a peaking amplifier biased to operate in Class C mode. A power divider splits the input signal equally to each amplifier with 90 degrees difference in phase. After amplification, the signals are recombined with a power combiner. When the amplifier's drive level is less than a specific value, only the Class AB carrier amplifier provides amplification and is presented with load impedance that produces high efficiency and gain. The role of the auxiliary cell is to actively modulate the main amplifier's load impedance while contributing to the output power at the same time.

When the input signal peaks (as is the case with high-PAR signals), the Class C peaking amplifier also begins to deliver amplification to handle the highest power output levels, and produces a load impedance that allows both amplifiers to provide the highest possible output power. The Doherty amplifiers can achieve high efficiencies as well as linear characteristics provided that the perfect load modulation scheme is realized.

It is well known, that the key action of the Doherty PA (DPA) occurs in the high power region where the auxiliary amplifier is activated and the main amplifier is held at the maximum voltage as shown in FIG. 1B. This is achieved through the dynamic load modulation of the main amplifier due to the load-pulling effect provided by the auxiliary amplifier. Due to the voltage-saturated operation of the main amplifier, the overall efficiency of the DPA is significantly improved as shown in FIG. 1C. This figure also shows that DPAs are ideally linear amplifiers. During the high power mode, the auxiliary amplifier's contribution to the output power compensates the square root power transfer function of the main amplifier to realize a linear input-output power characteristic. The DPAs linearity can also be studied from the intermodulation (IM) products point of view.

In the high power region, the two amplifiers generate IM products with 180 deg phase difference because the main amplifier has gain compression while the auxiliary one experiences gain expansion. Consequently, the IM products cancel out each other, leaving the DPA with a distortion-free characteristic. Yet, in practice, when a transistor is being used, the main amplifier do not obey to a constant saturation level at Vo max (unless it was reaching its nonlinear level much before), and therefore the overall output power do not act like a linear curve. A gain and phase compression occurs at the moment that the auxiliary amplifier begins to deliver power, and the IM products level is not as low as in theory.

However, a Doherty PA produces less linearity and RF output power than a Class AB amplifier. Moreover, the Doherty PA that is based on transistors such as FET's can truly provide a superior improvement of efficiency, but with the cost of some degradation in linearity performances. To have perfect linearity, the Doherty PA theory assumes that during the activation of the auxiliary amplifier the main amplifier reached already its saturation level. In practice, that is not the case due to the FET typical behavior. Furthermore, if it was the case then the linearity of the Doherty PA would have been degrade even before the auxiliary "on" state interval. Well-known design techniques such as adaptive bias, switched Doherty, and digital predistortion have been proposed for performance improvement in Doherty amplifiers.

Another well-known standalone efficiency-enhancement technique for DPA is the switching adaptive biasing as disclosed in U.S. Pat. No. 6,437,641 (known as XNN®-Based Power Amplifier Booster by Tower Semiconductor and Paragon Communications), which is used to get an improvement of efficiency by introducing a higher drain voltage to the FET when a peak level is reached. However, this method is limited due to the change of the transistor impedance in function of the Drain voltage level.

Therefore, in order to solve both methods limitations it is offered to use a novel approach that refers herein as an "Adaptive Impedance" method.

It is an object of the present invention to provide a power amplifier system that involve a main amplifier and one or more auxiliary amplifiers, which is capable of changing the impedance of the main amplifier adaptively, in such a way, that its new impedance in parallel to the new impedance of the auxiliary amplifier will be similar to the impedance of the auxiliary amplifier when it was inactive (i.e., at "off" state).

Other objects and advantages of the invention will become apparent as the description proceeds.

SUMMARY OF THE INVENTION

The present invention relates to a method of providing an adaptive impedance in a Power Amplifier (PA), comprising the steps of:

a. providing a main amplifier;
b. providing at least one auxiliary amplifier, in which during operation each of which switched between active or inactive operation mode; and
c. adapting the bias of the main amplifier with or without biasing also the Vg of the main and auxiliary amplifiers, thus the combined output impedance of the PA, as seen by an output load, is maintained constant regardless of whether the auxiliary amplifier is active or inactive.

According to an embodiment of the invention, the output impedance maintain constant by choosing Vd and Vg in a way, that one amplifier will compensate the distortion of the second amplifier (Main to Auxiliary and vice versa).

According to an embodiment of the invention, the method further comprises tuning Vg and Vd as to get smoother gain performances.

According to an embodiment of the invention, the method further comprises dynamically changing the Vg and Vd for both amplifiers together in order to have an Adaptive Biasing efficiency performances with a constant impedance, and therefore a flat gain response.

In another aspect, the present invention relates to a power amplifier (PA) system for applying impedance biasing, comprising:
a. a main amplifier;
b. at least one auxiliary amplifier, wherein both of said amplifier are transistors based; and
c. a voltage control means for adapting the bias of the main amplifier in such a way that the output impedance of the main amplifier when the auxiliary amplifier is inactive, is similar to the combined output impedance of the main and auxiliary amplifiers in parallel when the auxiliary amplifier is active, thus, the combined output impedance of the amplifiers, as seen by an output load, is substantially the same regardless of whether the auxiliary amplifier is active or inactive.

According to an embodiment of the invention, the load line as seen by the main amplifier is adaptively changing in such a way that it will get from the main amplifier linear and high efficiency performances.

According to an embodiment of the invention, during a power interval, one transistor is being used as a main transistor, when the rest of the transistors are being used as an impedance.

According to an embodiment of the invention, during a power interval, one transistor is being used as a main transistor, when the rest of the transistors are being used as a power linearize and/or phase linearize, and/or as efficiency improving.

According to an embodiment of the invention, for a video modulated signal, the transistors can be active during any power level, or just in part of the interval.

According to an embodiment of the invention, each transistor can change its quiescent current (in FET Vgs—class of operation), or it biasing level (in FET Vds) in function of RF power levels.

According to an embodiment of the invention, the power supply voltage amplitude of the main amplifier is lower in compare to a single transistor envelope tracking, and the main amplifier reach high efficiency even before that envelop tracking is active, as the power supply modulator efficiency is a function of the power drop, with low efficiency at backoff and higher efficiency at the peak levels, efficiency is gained.

In another aspect, the present invention relates to a method of providing an adaptive impedance in a Power Amplifier (PA), comprising: providing more than one transistors in which one transistor is used to change the load line or to linearize the input signal by adapting the biasing of each transistor, wherein the transistors are connected in parallel.

DETAILED DESCRIPTION OF THE INVENTION

Reference will now be made to several embodiments of the present invention, examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

In class A the impedance of a transistor that can be seen by the load is varied by the power source in a simple manner:

$$Rds = \frac{Vds}{Ids} \quad (1)$$

Assuming at class A that ids (Alternative Current—AC) variation is small, we can take Ids (Direct Current—DC) as a constant. Therefore, Rds is a linear function of Vds. Since at thot class of operation, the goal is to match the load to the conjugate impedance of the amplifier, the impedance will be a function of Vdd.

Figure 1A:
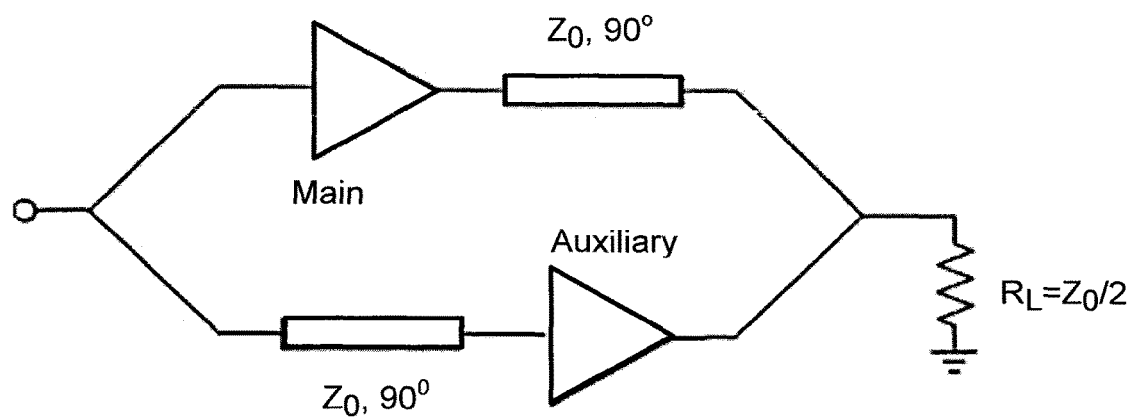
FIG. 1A schematically illustrates a block diagram of an ideal Doherty power amplifier (DPA), according to the prior-art.
Figure 1B:
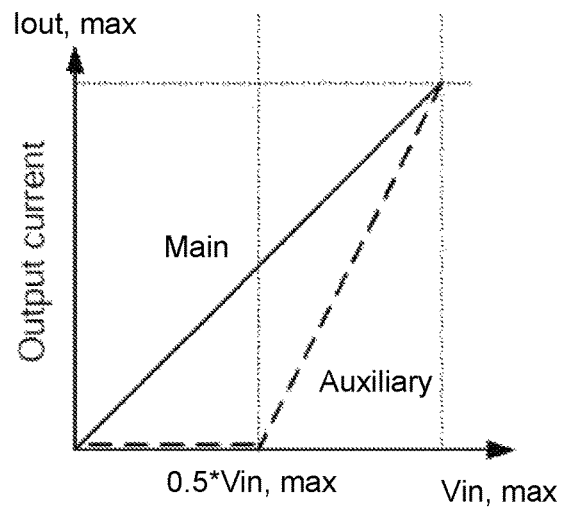
FIG. 1B is a graph showing the output currents of the DPA.
Figure 1C:
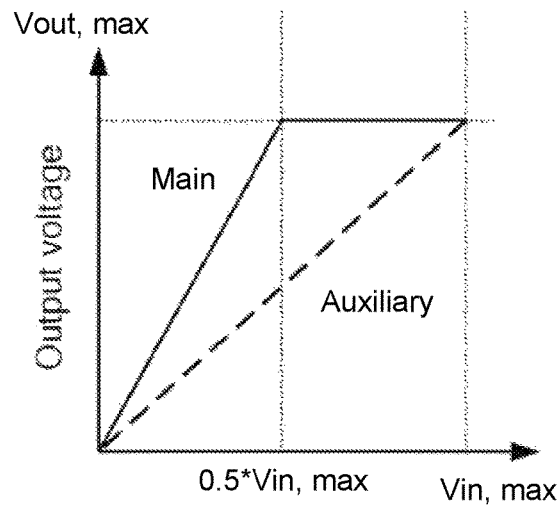
FIG. 1C is a graph showing the output voltages of the DPA.
Figure 1D:
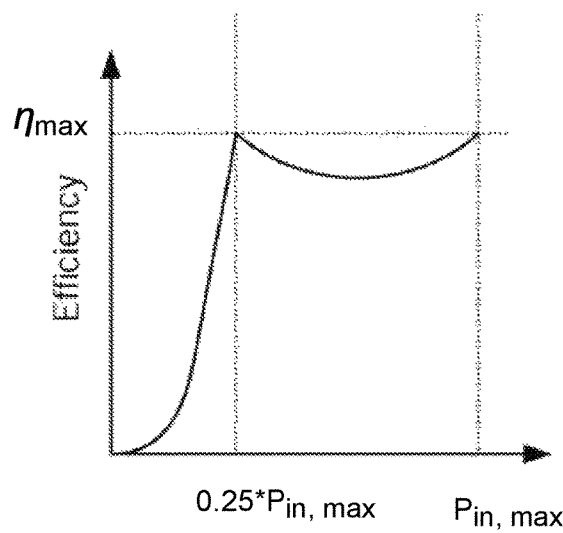
FIG. 1D is a graph showing the efficiency characteristics of the DPA.
Figure 1E:
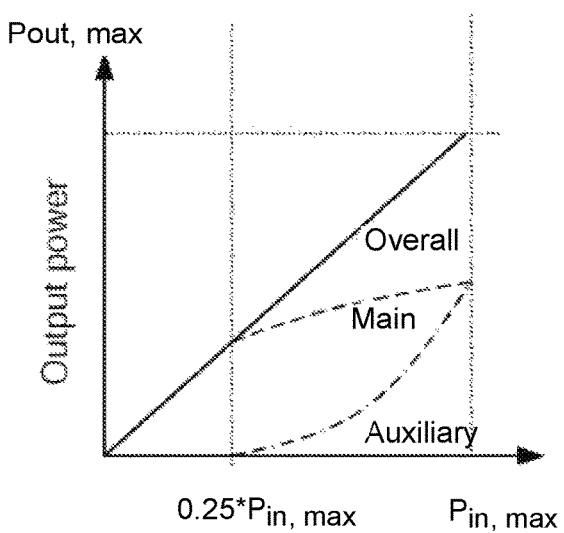
FIG. 1E is a graph showing the linearity characteristics of the DPA.
Figure 2A:
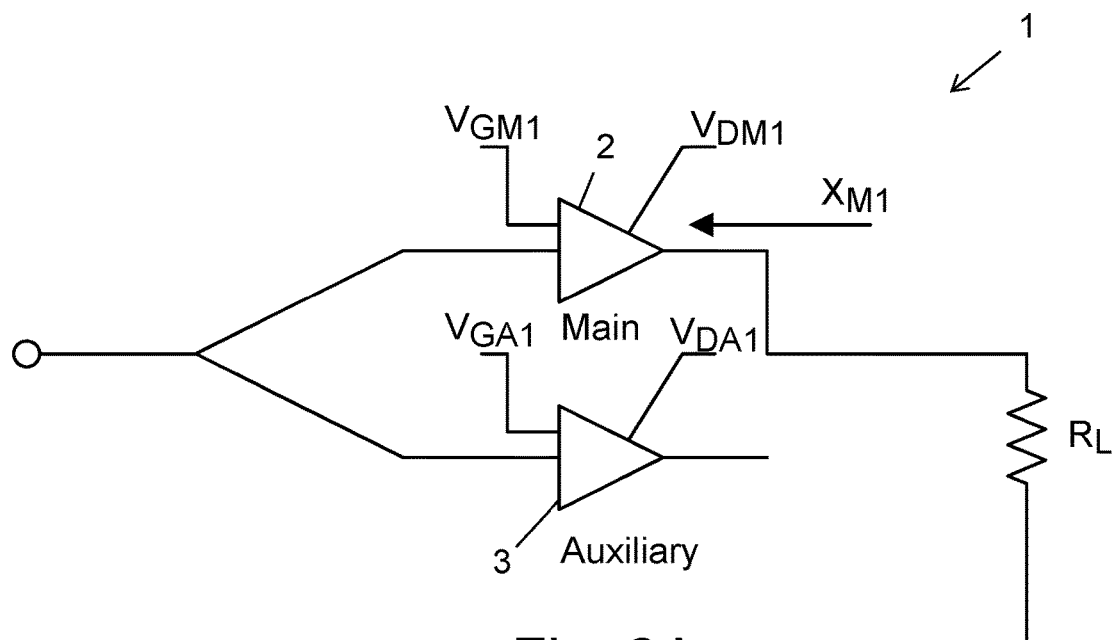
FIG. 2A schematically illustrates a block diagram of an Adaptive Impedance Amplifier having a main power amplifier (PA) and an auxiliary PA when the main PA is active and the auxiliary PA is inactive, according to an embodiment of the invention.
Figure 2B:
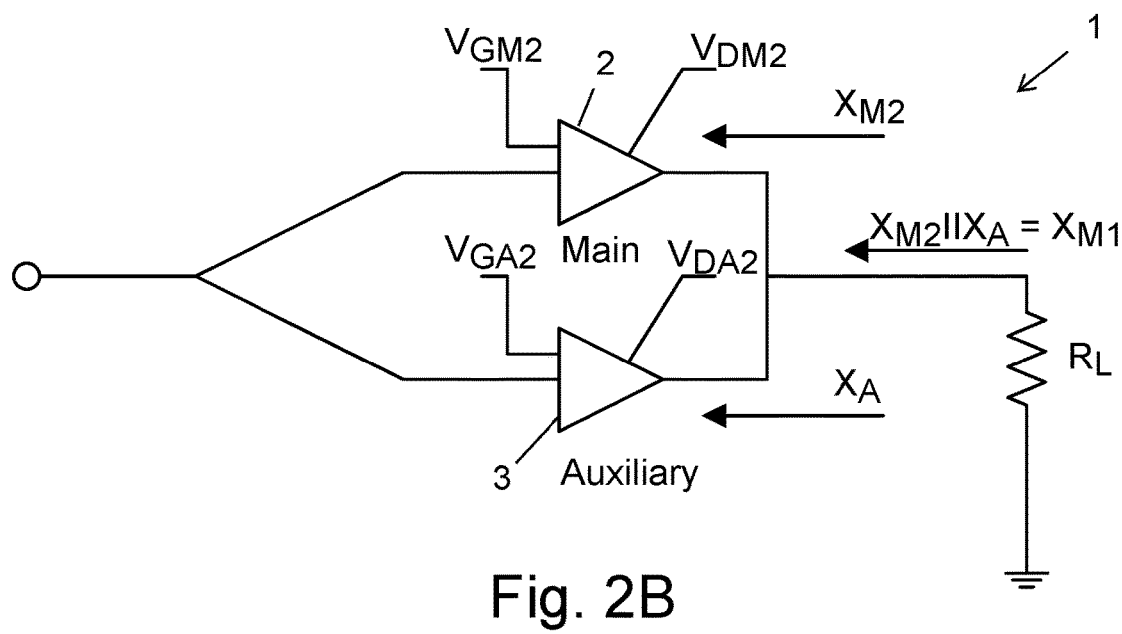
FIG. 2B schematically illustrates a block diagram of the Adaptive Impedance Amplifier when both main and auxiliary PAs are active, according to an embodiment of the invention.

FIGS. 2A and 2B show a circuit schematic of a power amplifier (PA) system that can be used in conjunction with the present invention for providing an Adaptive Impedance PA. The system generally indicated by numeral 1 in the figure comprises a main amplifier 2 and at least one auxiliary amplifier 3 for handling the peaks of the envelope signals. In this embodiment, the PA system is designed in such a way that the output impedance of the main amplifier 2 when the auxiliary amplifier 3 is off (i.e., inactive), is similar to the combined output impedance of the main and auxiliary amplifiers in parallel when the auxiliary amplifier 3 is on (i.e., active). Thus, the combined output impedance of the PA 1, as seen by an output load $R_L$ (Rload), is substantially the same regardless of whether the state of the auxiliary amplifier 3 is on or off. According to an embodiment of the invention, this can be achieved by adapting the bias of the main amplifier 2 with or without biasing also the gate voltage (i.e., Vg) applied to a terminal (the gate) of the main and auxiliary amplifiers, as will be described in further details hereinafter.

The method of such PA system for achieving an Adaptive Impedance, may work in one of the following ways:

Assuming the auxiliary amplifier 3 is at "off" state and then sharply turns "on" when the peak arrives. That can be performed by changing the Vg of the auxiliary amplifier 3.

Keeping the auxiliary amplifier 3 at class C so the amplitude of the Radio Frequency (RF) signal itself will open the amplifier.

Therefore, the auxiliary amplifier 3 reflects a variable in function of the input RF power that actually affects Vg. The drain voltage (i.e., Vd) in that situation must be an adaptive function of the RF power to keep constant Impedance/Gain/Phase. In both ways, the variation of Vd can work either to "fix" the total impedance to keep it as a constant and as an additional degree of tuning to keep the gain and phase over power flat (AM-PM, AM-AM).

According to this embodiment, as a replacement to the quarter wave transformer that is matching between the amplifiers. The offered method can be used for as many auxiliary amplifiers as required. Since it doesn't need a transformer between the amplifiers, it will be also size effective. Thus, the combined output impedance of the PA 1, as seen by the output load $R_L$, is substantially the same regardless of whether the auxiliary amplifier is on or off.

In FIG. 2A the main amplifier 2 is active and the auxiliary amplifier 3 is inactive. The main amplifier 2 is matched to the output load $R_L$. In FIG. 2B both the main amplifier 2 and the auxiliary amplifier 3 are active, but with a different biasing of the gate voltage of the main amplifier (Vgm2), the gate voltage of the auxiliary amplifier (Vga2) and the drain voltage of the main amplifier (Vdm2) and the drain voltage of the auxiliary amplifier (Vda2) to achieve similar impedance to the one that was when just the main amplifier 2 was active. In general, several variations are possible. Vg for all PA's can be kept as a constant and the variation may be applied only on Vd. Vd can be equal in both amplifiers or non-equal, when the main amplifier 2 can be biased by Vg in class AB, and the auxiliary amplifier 3 in class C, it is possible to switch between voltage levels in one or more steps, or to adaptively tune them in function of the RF power envelope levels.

The drain voltages of the auxiliary amplifier 3 are indicated as Vda1 at FIG. 2A and as Vda2 at FIG. 2B. The drain voltages of the main amplifier 2 are indicated as Vdm1 at FIG. 2A and as Vdm2 at FIG. 2B. The gate voltages of the auxiliary amplifier 3 are indicated as Vga1 at FIG. 2A and as Vga2 at FIG. 2B. The gate voltages of the main amplifier 2 are indicated as Vgm1 at FIG. 2A and as Vgm2 at FIG. 2B.

The Adaptive Impedance method predicts to have flat gain response in compare to the Doherty PA. It is feasible, thanks to the voltage control of the amplifiers 2, 3 that keeps the impedance seen by the load $R_L$, Xm1 as a constant, and therefore, will have better linearity. In compare to the adaptive biasing method, it is predicted to achieve also better gain behavior thanks to the constant impedance. Efficiency should be similar or even better in compare to both methods.

In Class A, the adaptive impedance method is that a solution of the equation (3), and flat gain response, can be achieved by varied Vd and Vg of the amplifiers.

It is clear that:

$$\begin{bmatrix} Xpa = X_{M1} & \text{Auxiliary} = \text{Off} \\ Xpa = \frac{X_{M2} \times X_A}{X_{M2} + X_A} & \text{Auxiliary} = \text{On} \end{bmatrix} \quad (2)$$

Where Xpa represents the impedance

Since $X_M=F(Vd,Vg)$, we can find Vda1/Vdm1/Vda2/Vdm2 (they can be equal or non-equal) and Vgm1/Vga1/Vga2/Vgm2 such that will keep Xpa as a constant. And therefore we are looking for the solution of:

$$X_{M1} = \frac{X_{M2} \times X_A}{X_{M2} + X_A} \quad (3)$$

The solution of that equation can be found in RF Amplifiers by looking at the reflection coefficient of an Amplifier high power model.

In addition, as a standalone method, or as an additional method to the claim of keeping the Impedance as a constant, another level of linearization grantee, can be applied by choosing Vd and Vg in a way, that one PA will compensate the distortion of the second amplifier (Main amplifier to Auxiliary amplifier and vice versa). It can be considered as an active way to the quarter wave transformer of the Doherty Amplifier distortion compensation.

In this invention, the power combining of the RF signal on the transistor output, is done just by connecting both Drain terminals of the transistors of each amplifier together with a short circuit (with or without a DC coupling capacitor between them). Yet, to get 180 degrees between standing waves, a 90 degree line between the transistors may be considered.

In Class AB, B, and C the goal is to deliver the max possible power:

$$P\max = Vdc * \frac{I\max}{4} \qquad (4)$$

The Load Line will be therefore:

$$Rload = \frac{V\max}{I\max} \qquad (5)$$

Where, the Load Line represents the maximum power that a given transistor can deliver, and it is determined by the power supply voltage and the maximum current of the transistor.

In envelope tracking the ratio between the maximum voltage (Vmax) and the maximum current (Imax) is kept constant and therefore the Rload ($R_L$) is a constant as well. The drain efficiency is also kept $$\frac{\pi}{4}$$

across the power range.

In practice, due to the knee affect, to keep maximum efficiency and power delivering, the load resistance that is being reflected to the transistor is increasing. One solution is to work in backoff, but that doesn't allow using 100% of the voltage amplitude, by the cost of losing some efficiency.

The method presented, is based on the concept that two or more transistors are connected in parallel to the load. A matching network might be needed to match the transistors to the load, as shown with respect to an equivalent circuit in FIG. 10.

During power interval, one transistor is being used as a main transistor, when the rest of the transistors are being used as an impedance, and/or power linearize, and or phase linearize, and or efficiency improving.

For modulated signal, the transistors can be active during any power level, or just in part of the interval. Each transistor can change its quiescent current (in FET Vgs—class of operation), or it biasing level (in FET Vds) in function of RF power levels.

Figure 10:
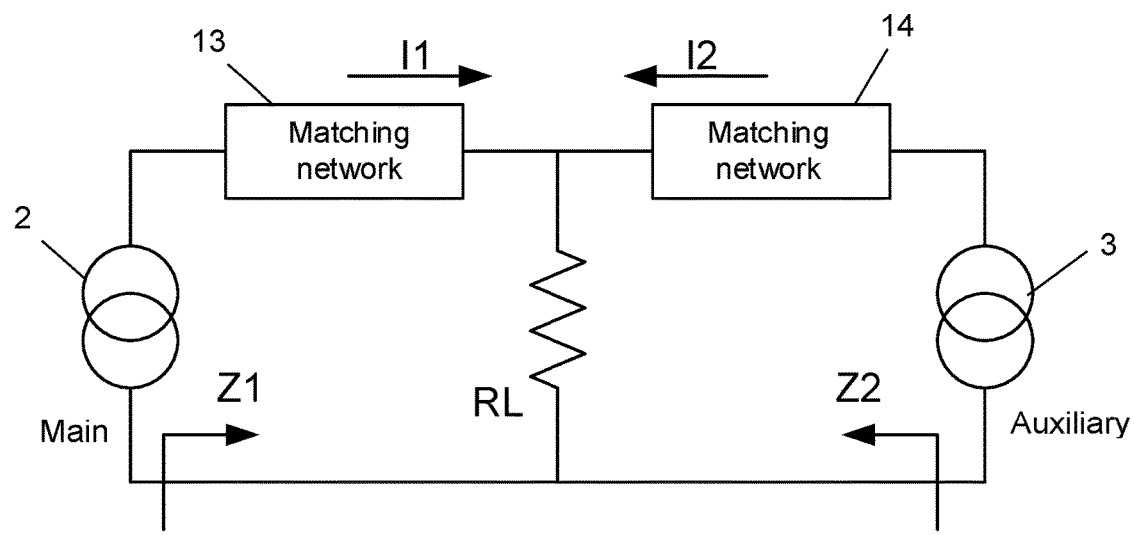
FIG. 10 schematically illustrates an equivalent amplifier circuitry with two transistors, when one functions as a main transistor (derived in class AB or B), and the other transistor functions as an auxiliary transistor (derived in class C) and works just during peak power intervals, according to an embodiment of the invention.
Figure 11:
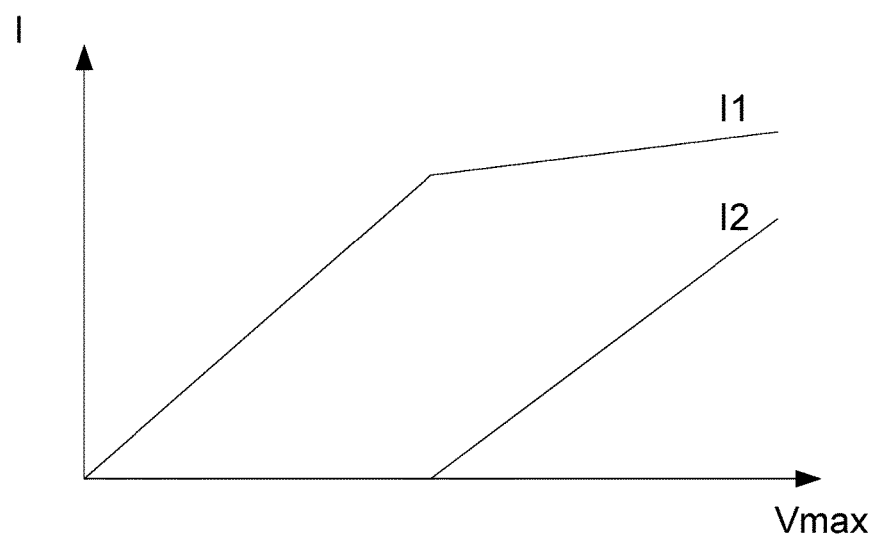
FIG. 11 is a graph that shows the currents of the equivalent amplifier circuitry of FIG. 10.

Referring now to FIGS. 10 and 11, one example of such use is two transistors, when one functions as a main transistor 2, and derived in class AB or B. The other transistor functions as an auxiliary transistor 3, and is derived in class C and works just during peak power intervals. The matching network of the main transistor 2 is indicated by numeral 13 and matching network of the auxiliary transistor 3 is indicated by numeral 14. That architecture, when biasing correctly, is able to keep linearity, efficiency, and max power delivering. Actually, adjustment of each transistor by the Gate and Drain voltage (in FET, but in BJT it can work as well), can maintain linearity, efficiency, and max power delivering tough, or better to say, thanks to the variance of the transistor parameters (such as load line angle keeps best Power Added Efficiency (PAE)) with biasing its Gate and Drain voltage. During the peak power intervals the auxiliary transistor 3 is changing the load line that is reflected to the main transistor 2, in a way that the load line will provide to the main transistor matching conditions to have better efficiency, higher power, and or better linearity.

Furthermore, as shown in the graph of FIG. 11, the behavior of the current I1 is derived from the knee effect of the main transistor, and the behavior the current I2 is derived from the Class C of the auxiliary transistor.

Still, the system, by manipulating the biasing of the transistors, is also able to overcome the variance of conductance (gm) over Vd as appears in the non-ideal transistors.

The main amplifier will "see" an impedance of:

$$Z1 = RL\left(1 + \frac{I2}{I1}\right) \qquad (6)$$

If we are changing the biasing parameters of the main amplifier 2, as naturally being performed in Envelop Tracking, which keeps the load that is providing our goal performances of the system (such as Efficiency, linearity, etc.) equal to Z1, that will be a perfect matching conditions. The main claim is that such a combination, that actually reflects dynamic load line, is an advantage since an envelope tracking amplifier will have the highest efficiency when that dynamic load is being presented.

Another advantage of that method is that the power supply voltage amplitude of the main amplifier 2 can be lower in compare to a single transistor envelope tracking, thanks to the fact that the main amplifier 2 can reach high efficiency even before that envelop tracking is active. Since the power supply modulator efficiency is a function of the power drop as well, with low efficiency at backoff and higher efficiency at the peak levels, we can also gain here in efficiency.

Changing the biasing of the main and auxiliary amplifiers, is also can be used as an "automatic" matching correction system, when a change in the load impedance have been performed (for example, when holding an antenna of a transmitter with bare hands).

Figure 12:
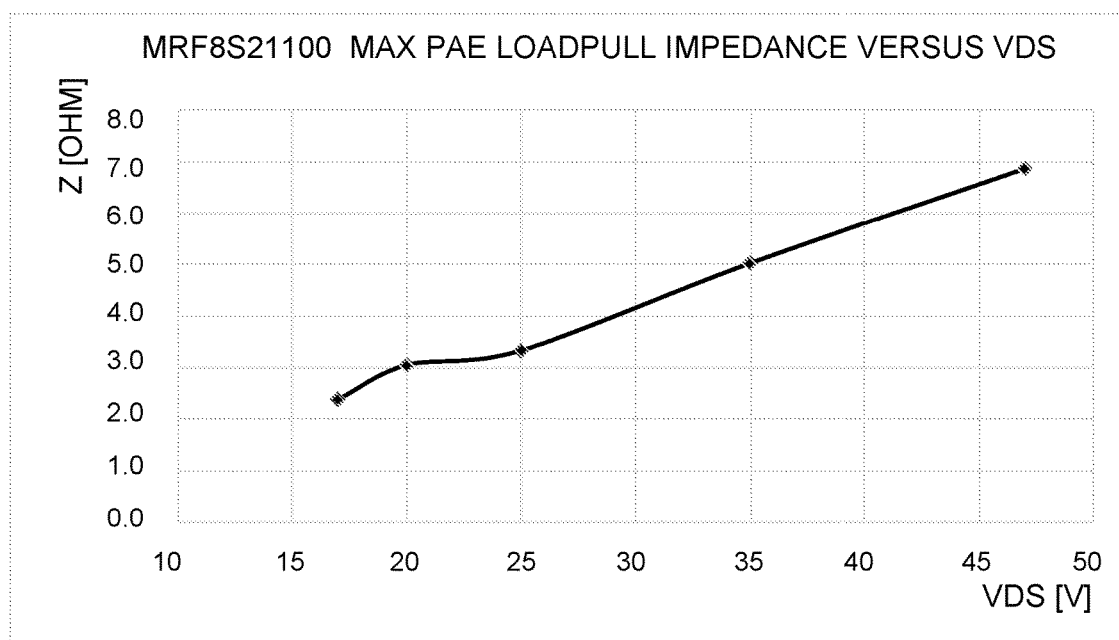
FIGS. 12 and 13 schematically illustrates a loadpull data simulation for a MRF8S21100 RF laterally diffused metal-oxidesemiconductor (LDMOS) field-effect transistors (FETs) by Freescale.
Figure 13:
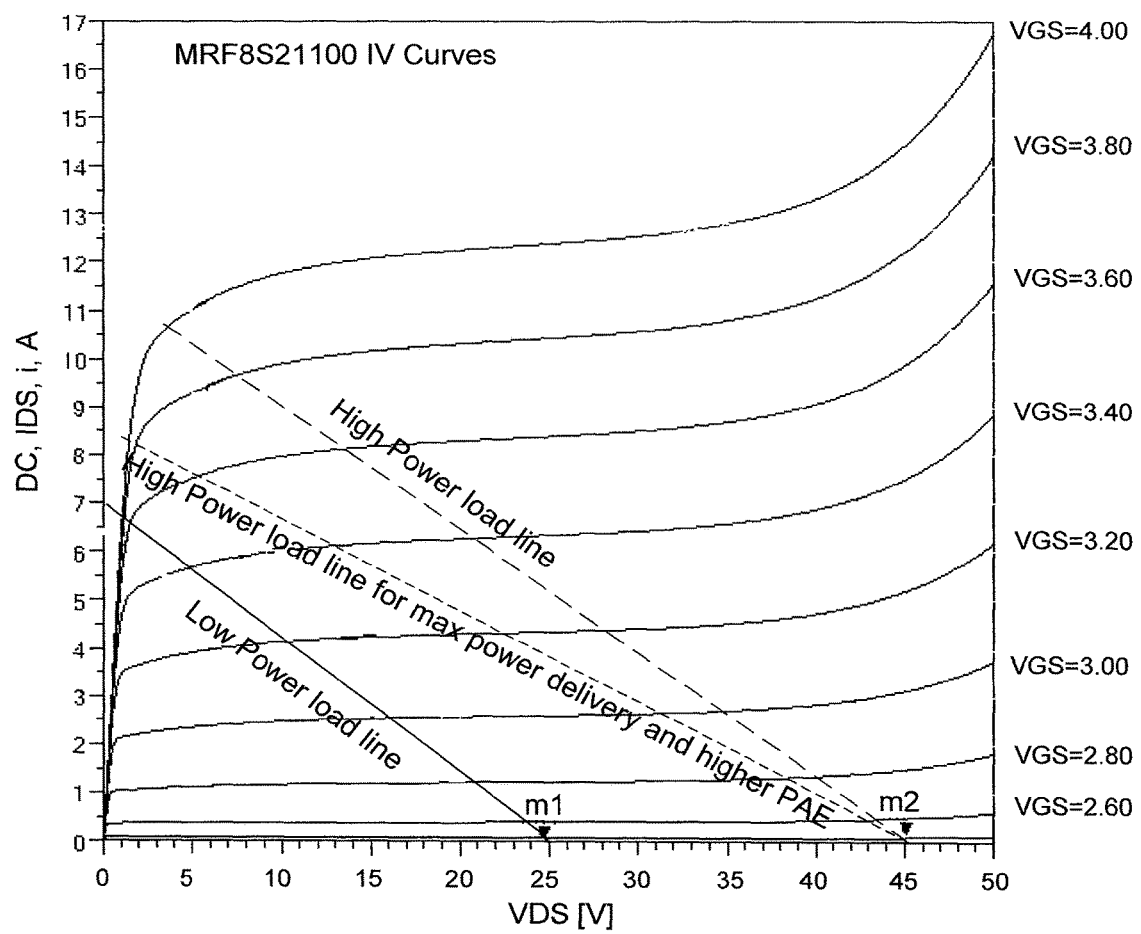

Referring now to FIGS. 12 and 13, as an example, a loadpull data simulation for a MRF8S21100 RF laterally diffused metal-oxidesemiconductor (LDMOS) field-effect transistors (FETs) by Freescale is shown. For Vgs=2.7V (Class AB) Idq=0.7 A the transistor provides best PAE with the impedance values as indicated in the graph of FIG. 12.

It can be easily seen from the graph, that in order to keep maximum PAE for any Vds, Z load is not a constant. It can be explained by the transistor non ideal behavior such as the knee affect as shown in FIG. 13, in a low power load line (as indicated by the marker m1) and in a high power load line and a high power load line for maximum power delivery (as indicated by the marker m2).

All the above will be better understood through the following illustrative and non-limitative examples.

Figure 3:
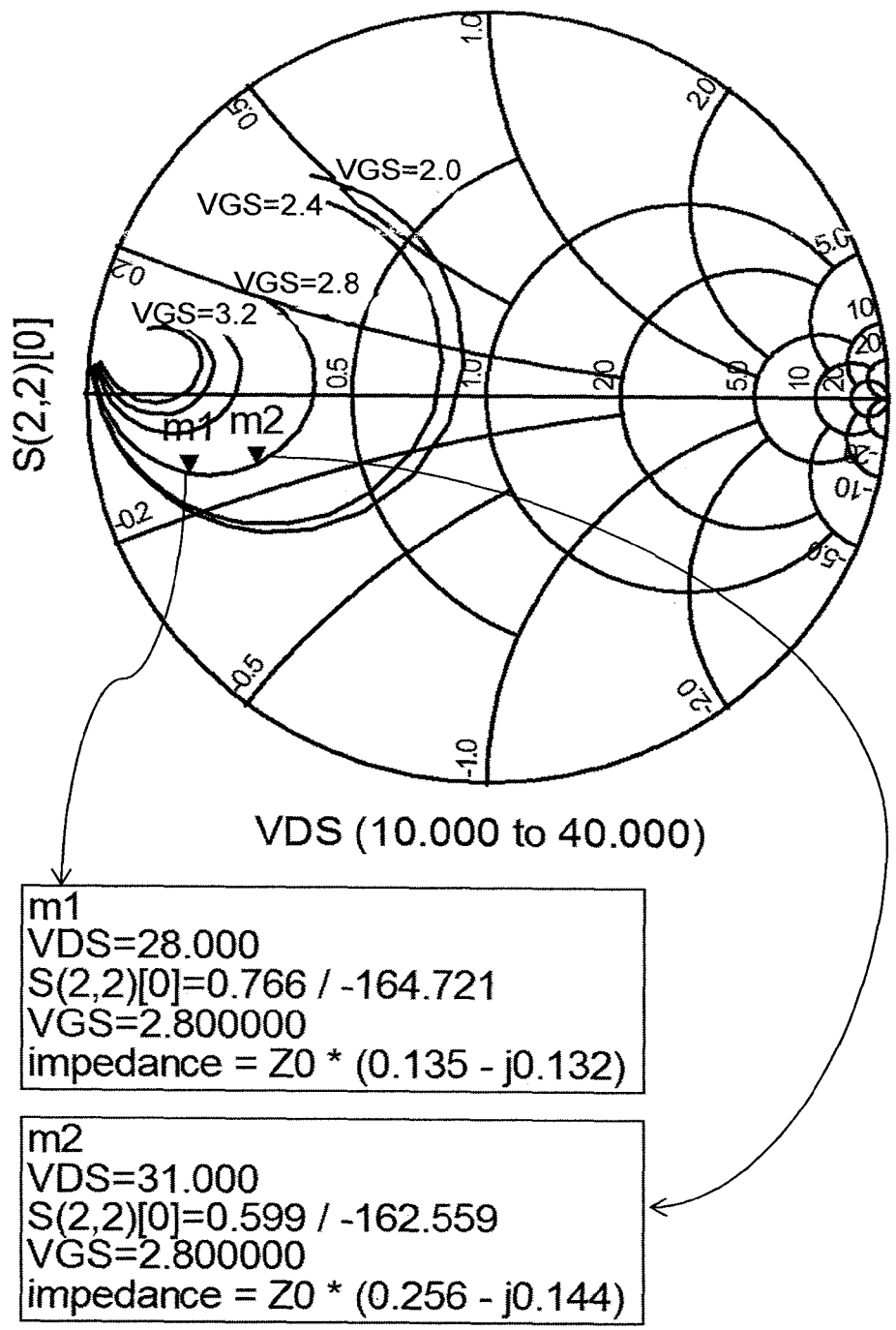
FIG. 3 shows a small signal output reflection coefficient of MRF8S21100.

As an example for the implementation of system 1 (as described hereinabove with respect to FIGS. 2A and 2B), the Freescale MRF8S21100 RF laterally diffused metal-oxide-semiconductor (LDMOS) field-effect transistors (FETs) can be used, which its load impedance curves can be followed at FIG. 3.

In FIG. 3, the two markers, m1 and m2 reflect a change at the output impedance of the transistor. In this case the impedance is close to be multiplied just by varying Vd when Vg being kept constant. In impedance Biasing we want to drive both the main amplifier 2 and the auxiliary amplifier 3 with Vd=24V and the gate voltage of the main amplifier 2 (Vgm=2.8V) when the gate voltage of the auxiliary amplifier 3 (Vga) is below the peaking level. When reaching the peaking level and up to the peak high Vd for both main and auxiliary amplifiers will be set to approximately 31V, and the Vg of the auxiliary amplifier 3 will be changed to 2.8V. So in that example both amplifiers will function at Class A or Class AB when they both active, while the parallel impedance of both amplifiers will be kept as a constant. Naturally, it is possible to slightly tune Vg and Vd to get smoother gain performances. It is also possible to dynamically change the Vg and Vd for both amplifiers together in order to have an Adaptive Biasing efficiency performances with a constant impedance, and therefore a flat gain response. Another option may be to choose two different transistors for matching and efficiency considerations.

Figure 4:
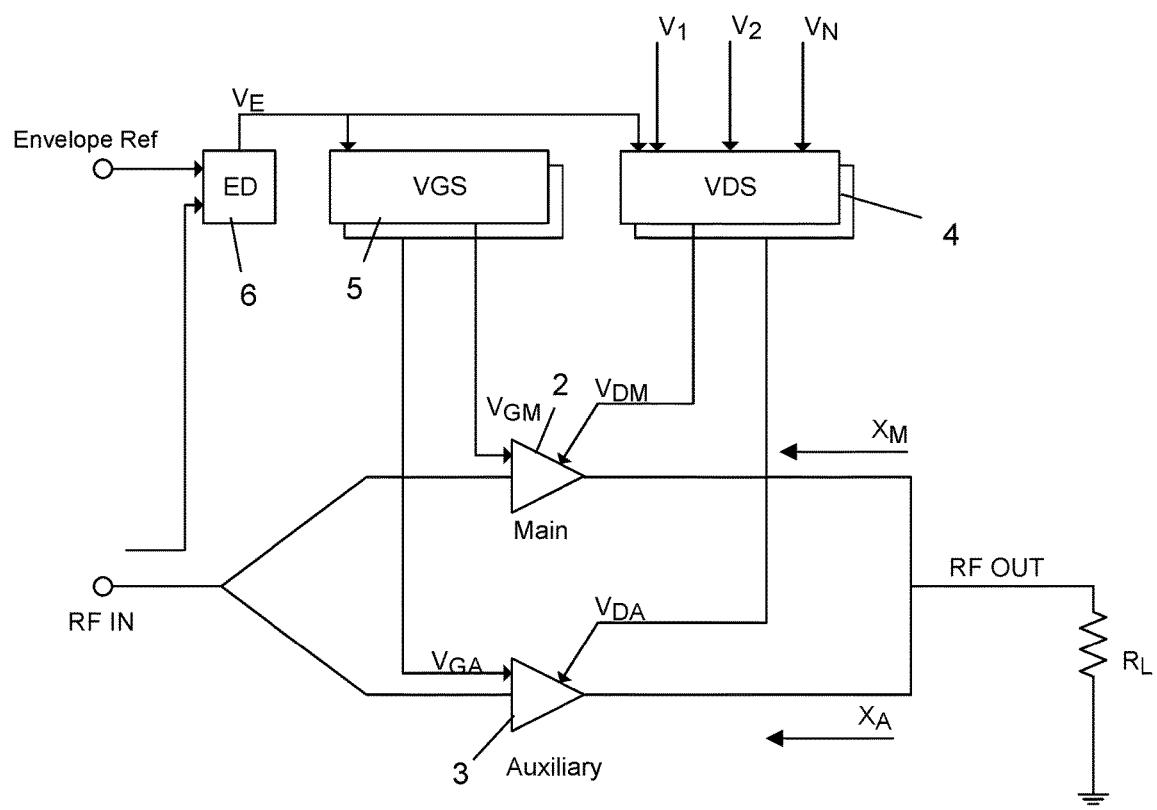
FIG. 4 schematically illustrates an optional configuration of the Adaptive Impedance Amplifier with RF detector, Vd switcher block and a Vg switcher block, according to an embodiment of the invention.

As will be appreciated by a person skilled in the art, there are several solutions in the market to adaptively bias an amplifier, similar techniques with some "levels" modifications could be performed here as well. For example, at FIG. 4 we can find an Envelope Detector (ED) 6 that being active above reference level (set the high of the peak that first active the biasing circuitry). A VGS switcher block 5 sets the bias of the Vg, and a VDS switcher block 4 sets the bias of the Vd of the main amplifier 2 and the auxiliary amplifier 3.

Figure 5:
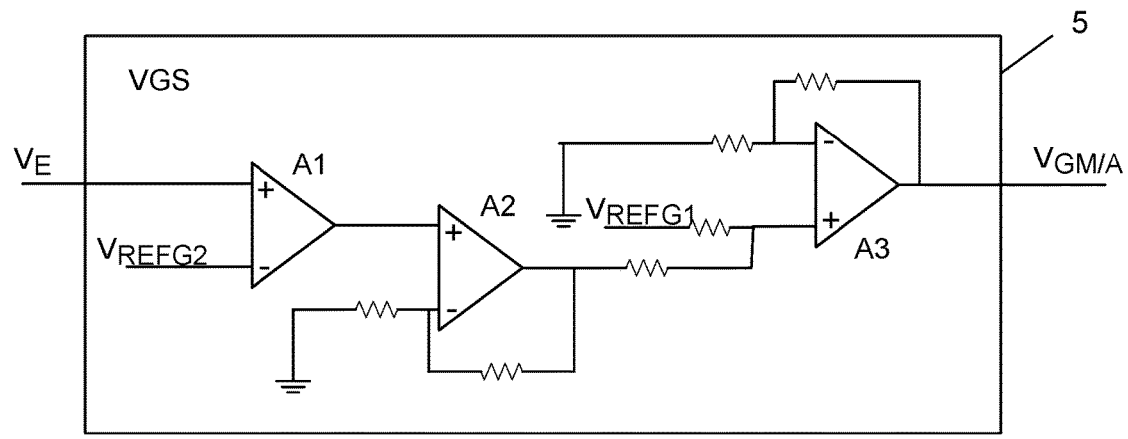
FIG. 5 schematically illustrates an optional configuration for the Vg switcher block of FIG. 4, according to an embodiment of the invention.

To build those blocks, couple of circuits may be offered. Some from the portfolio of companies like Qualcom or Nujira. For example, as shown in FIG. 5, the VGS switcher block 5 may involve the following:

A comparator A1 gets the envelope level, Vrefg2 sets the level it become at high position, an Operational Amplifier (OPA) A2 sets the required gain, and an amplifier A3 sets the final Vg as a constant that being sets by Vrefg1+the value of OPA A2. That circuit with equal or different resistors and reference values can be used for both PA's gates.

VDS switcher block 4 that serves as a Vd switcher, can be performed in several ways as well, one way is described below with respect to FIG. 6.

Figure 6:
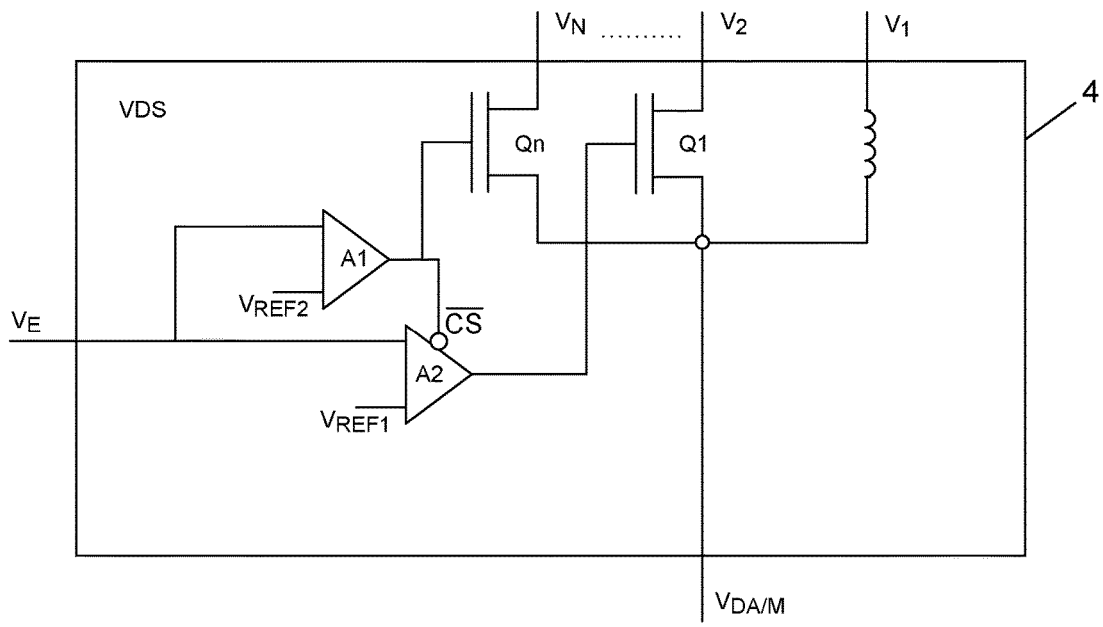
FIG. 6 schematically illustrates an optional configuration for the Vd switcher block of FIG. 4, according to an embodiment of the invention.

The suggested Vd switcher in FIG. 6 is delivering to the PA V1 before reaching the peaking level, and then Q1, Q2, Q3, or Qn are being chosen for higher voltage levels (up to Vn) depending on the required voltage level. This circuit may be used for both amplifiers 2 and 3 together (shares the same Vd) or separately.

Figure 7:
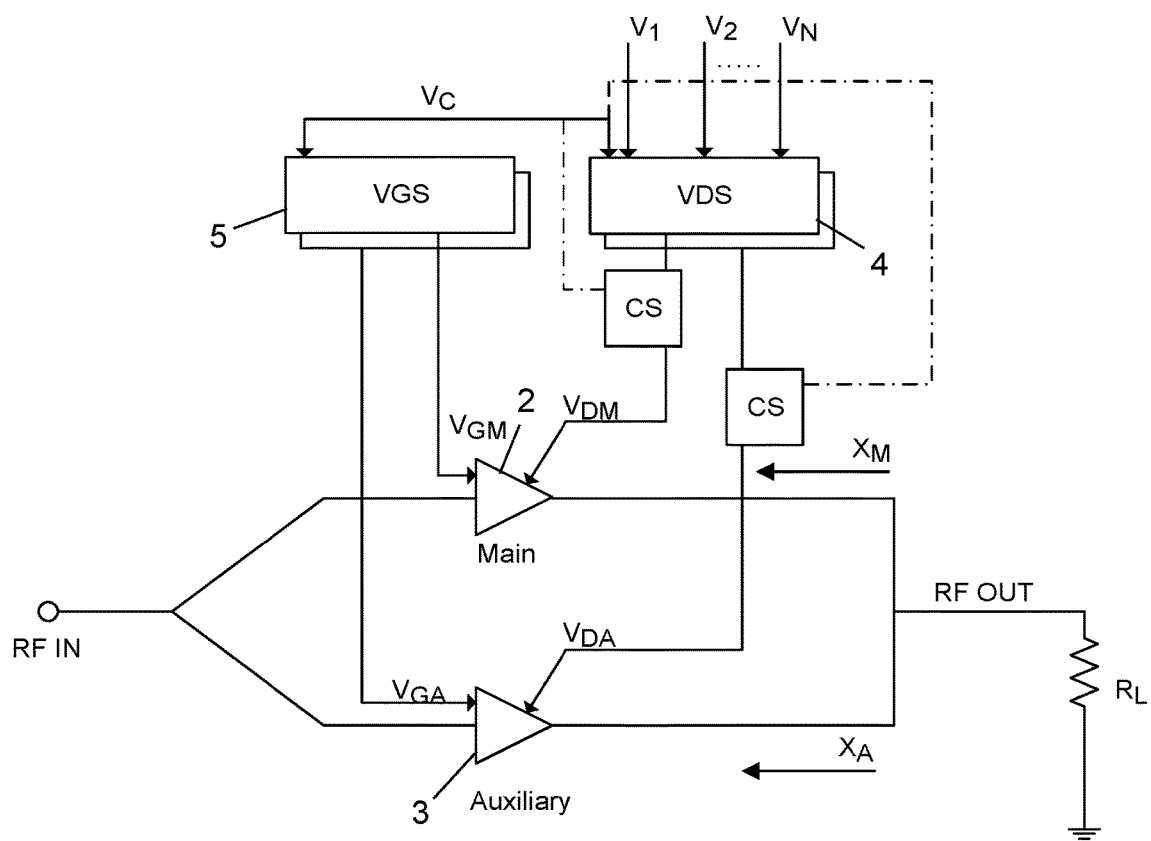
FIG. 7 schematically illustrates an optional configuration of the Adaptive Impedance Amplifier with current sample and switching Vd block, according to an embodiment of the present invention.

Referring now to FIG. 7, an alternative to the envelope detector can be offered. It is using a current sampler on the main amplifier 2 or on the auxiliary amplifier 3 to control the biasing levels of the amplifiers.

Figure 8:
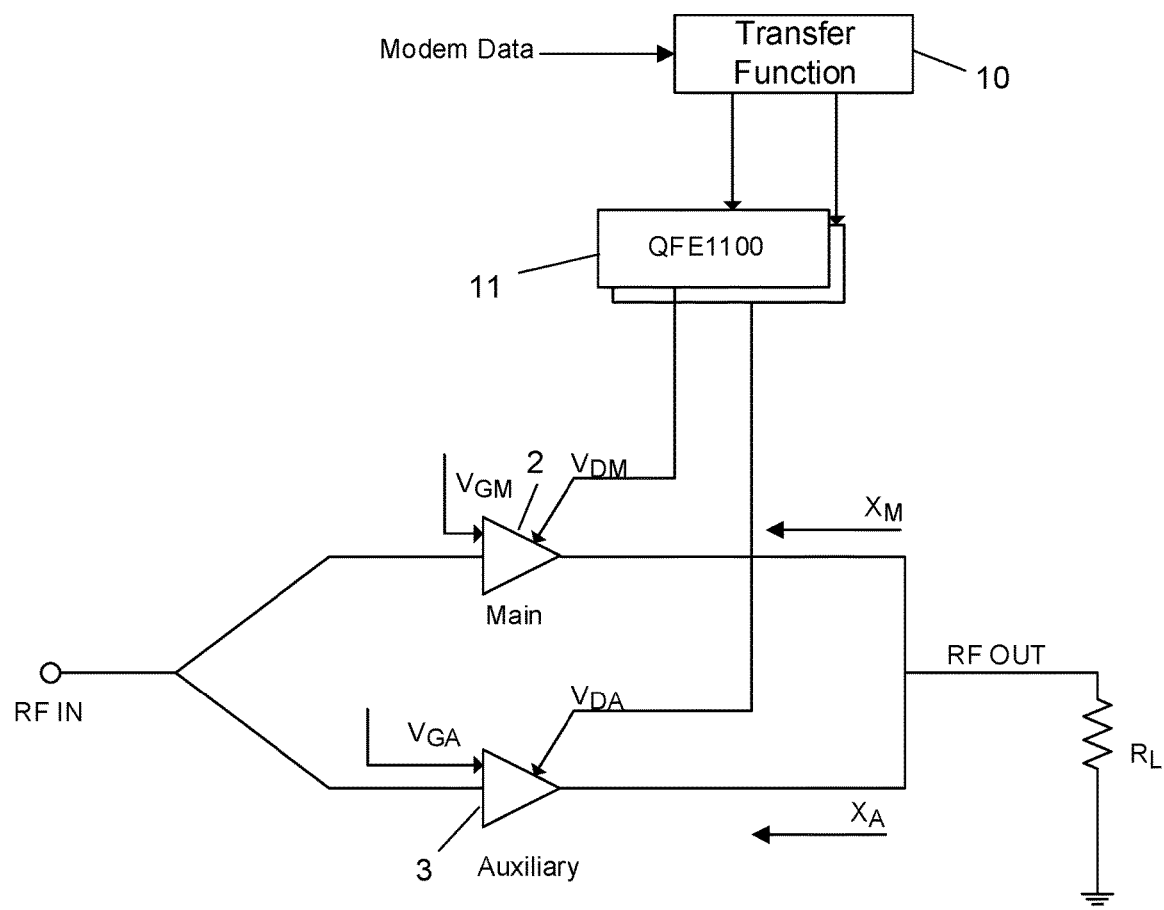
FIG. 8 schematically illustrates an optional configuration of the Adaptive Impedance Amplifier using a modem data, according to an embodiment of the present invention.

If there is access to the base band data, it is optional to use adaptive biasing "off the shelf" parts as the element QFE1100 by Qualcom (as indicated by numeral 11 in FIG. 8). A transfer function 10 might be required to adjust the device to the adaptive biasing requirements for the main amplifier 2 and the auxiliary amplifier 3. Such a configuration is shown in FIG. 8.

Figure 9:
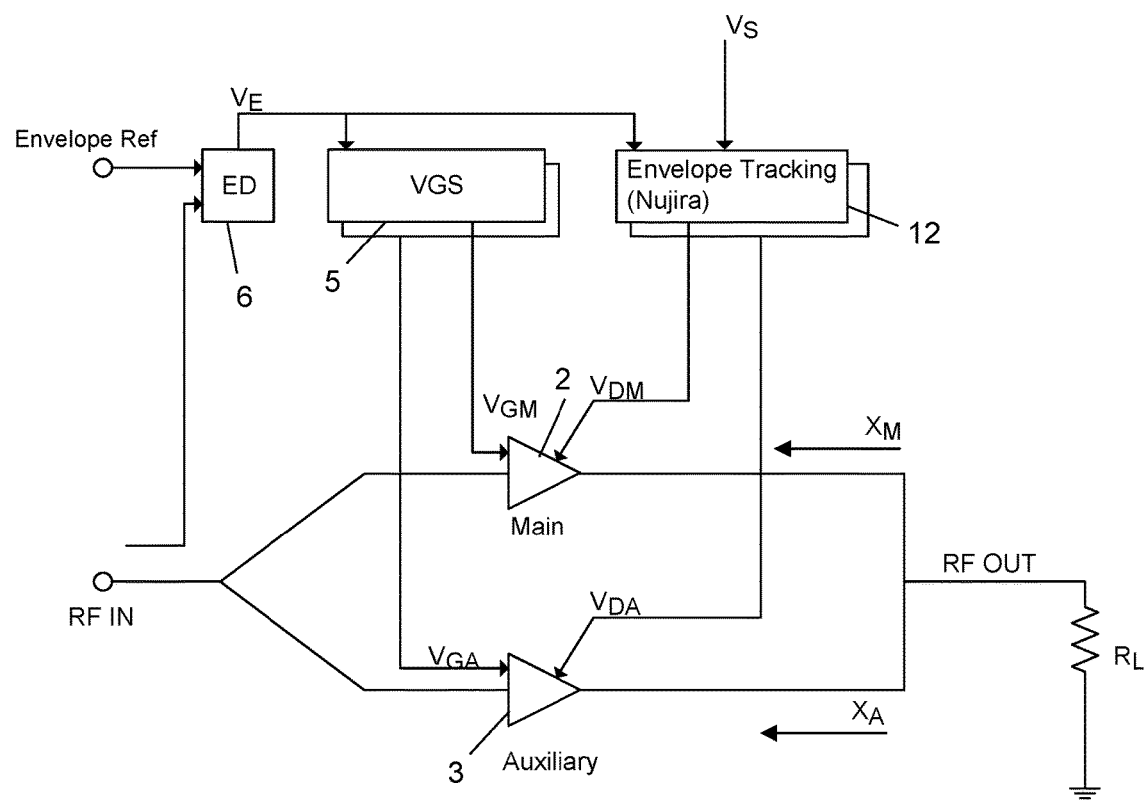
FIG. 9 schematically illustrates an optional configuration of the Adaptive Impedance Amplifier using adaptive biasing technology, according to an embodiment of the invention.

Another topology that can be used is based on Nujira Adaptive Biasing technology (as indicated by numeral 12 and presented in FIG. 9).

Farther degree of linearization may be provided by an envelope detector added to the load with a feedback to the Gate and Darin voltage levels. It can be added to any of the diagrams suggested hereinabove with respect to FIGS. 4 and 7-9.

There should be no limitation to the transistors technologies that might be used. Any technology that can work for a regular RF amplifier will probably fit here as well. LDMOS, GaAs, and GaN devices will fit. Following, the concept of the Adaptive Impedance with an internally matched device MRF8S21100 from Freescale is shown, but non matched devices can be used as well.

All the above description and examples have been given for the purpose of illustration and are not intended to limit the invention in any way. Those skilled in the art will perceive improvements, changes, and modifications. Such improvements, changes, and modifications within the skill of the art are intended to be covered by the appended claims. Many different scheme and electronic elements can be employed, all without exceeding the scope of the invention.

The invention claimed is:

1. A method of providing an adaptive impedance in a Power Amplifier (PA), comprising the steps of
   a) providing a main amplifier;
   b) providing at least one auxiliary amplifier, symmetric or asymmetric, in which during operation each of which switched between active or inactive operation mode; and
   c) adapting the bias of the main amplifier with or without biasing also the Vg of the main and auxiliary amplifiers, thus the combined output impedance of the PA, as seen by an output load, is maintained constant regardless of whether the auxiliary amplifier is active or inactive;
   wherein there is no quarter wave transformer between the main and auxiliary amplifiers or there is no need for a transformer to keep the combined impedance constant.

2. A method according to claim 1, wherein the output impedance maintains constant by choosing Vd and Vg in a way, that one amplifier will compensate the distortion of the second amplifier (Main to Auxiliary and vice versa).

3. A method according to claim 1, further comprising tuning Vg and Vd as to get smoother gain performances.

4. A method according to claim 1, further comprising dynamically changing the Vg and Vd for both amplifiers together in order to have an Adaptive Biasing efficiency performances with an adaptive impedance, and therefore obtaining a flat gain, and/or phase response and/or a higher efficiency response.

5. A power amplifier (PA) system, comprising:
   a) a main amplifier;
   b) at least one auxiliary amplifier, wherein both of said amplifier are transistors based; and
   c) a voltage control means for adapting a bias of the main amplifier in such a way that an output impedance of the main amplifier when the auxiliary amplifier is inactive, is similar to a combined output impedance of the main and auxiliary amplifiers in parallel when the auxiliary amplifier is active;
   wherein there is no quarter wave transformer between the main and auxiliary amplifiers or there is no need for a transformer to keep the combined impedance constant.

6. A system according to claim 1, when the amplifiers are being used as a method to improve linearity, and/or efficiency of an envelope tracking amplifier, and/or adaptive biasing amplifier, with or without harmonics tuning.

7. The system according to claim 5, in which the combined output impedance of the amplifiers, as seen by an output load, is substantially the same regardless of whether the auxiliary amplifier is active or inactive.

8. The system according to claim 5, in which a load line as seen by the main amplifier is adaptively changing in such a way that it will get from the main amplifier linear and high efficiency performances.

9. A system according to claim 5, in which during a power interval, one transistor is being used as a main transistor, when the rest of the transistors are being used as an impedance.

10. A system according to claim 5, in which during power interval, one transistor is being used as a main transistor, when the rest of the transistors are being used as a power linearize and/or phase linearize, and/or as efficiency improving.

11. A system according to claim 5, in which for a modulated signal, the transistors can be active during any power level, or just in part of the interval.

12. A system according to claim 5, in which each transistor can change its quiescent current (in FET Vgs—class of operation), or it biasing level (in FET Vds) in function of RF power levels.

13. A system according to claim 7, in which power supply voltage amplitude of the main amplifier is lower in compare to a single transistor envelope tracking, and the main amplifier reach high efficiency even before that envelop tracking is active, as the power supply modulator efficiency is a function of the power drop, with low efficiency at backoff and higher efficiency at the peak levels, efficiency is gained.

14. A system according to claim 5, further comprising providing more than one transistors in which one transistor is used to change the load line or to linearize the input signal by adapting the biasing of each transistor, wherein the transistors are connected in parallel.

15. A system according to claim 5, in which two or more transistors are connected in parallel to an output load so that adjustment of each transistor by the Gate and/or Drain voltage maintains linearity, and/or efficiency, and/or max power delivering, and the load line angle keeps best Power Added Efficiency (PAE).

16. A system according to claim 5, in which changing the biasing of one or more amplifiers, is used as an "automatic" matching correction system, when a change in the load impedance have been performed.

17. A system according to claim 5, further comprising one or more additional amplifiers, which affects each other according to the formula where the impedance equal to the load multiplied by 1+ration between the currents at the loads.

18. A system according to claim 5, when the amplifiers are being used as a method to improve linearity, and/or efficiency of an envelope tracking amplifier, and/or adaptive biasing amplifier, with or without harmonics tuning.

* * * * *